United States Patent [19]

Goriletsky et al.

[11] 4,203,951
[45] May 20, 1980

[54] APPARATUS FOR GROWING SINGLE CRYSTALS FROM MELT WITH ADDITIONAL FEEDING OF COMMINUTED CHARGE

[76] Inventors: Valentin I. Goriletsky, ulitsa Otokara Yarosha, 17, kv. 53; Oleg S. Mjulendorf, ulitsa Geroev Truda, 47b, kv. 242; Alexei V. Radkevich, ulitsa Zernovaya, 53, kv. 56; Lev G. Eidelman, ulitsa Otokara Yarosha, 17, kv. 53, all of Kharkov, U.S.S.R.

[21] Appl. No.: 854,237

[22] Filed: Nov. 23, 1977

[30] Foreign Application Priority Data

Nov. 23, 1976 [SU] U.S.S.R. ............................ 2421865[I]

[51] Int. Cl.² .................................................. B01J 17/18
[52] U.S. Cl. ..................................... 422/249; 156/608
[58] Field of Search .......................... 156/608, 617 SP; 23/273 SP; 422/249, 247

[56] References Cited

U.S. PATENT DOCUMENTS

| | | | |
|---|---|---|---|
| 2,892,739 | 6/1959 | Rusler | 156/605 |
| 3,241,925 | 3/1966 | Cakenberghe | 156/608 |
| 3,265,469 | 8/1966 | Hall | 156/608 |

FOREIGN PATENT DOCUMENTS

939102 10/1963 United Kingdom ...................... 23/301

*Primary Examiner*—Hiram H. Bernstein
*Attorney, Agent, or Firm*—Steinberg & Blake

[57] ABSTRACT

The apparatus may be used for growing large-sized single crystals, such as optical and scintillation alkali halide single crystals, as well as semiconductor single crystals, from melt.

The apparatus comprises means for pulling a single crystal from melt and a crucible made of two containers mounted coaxially in each other to define an annular space therebetween to which a charge is fed. The inner container protrudes downwards relative to the outer container, and melt is contained in the protruding portion thereof.

Apertures are provided in the side wall of the inner container at the level of the bottom wall of the outer container for overflow of melt from the annular space to the inner container. Independent heaters are provided under the inner and outer container, respectively.

2 Claims, 1 Drawing Figure

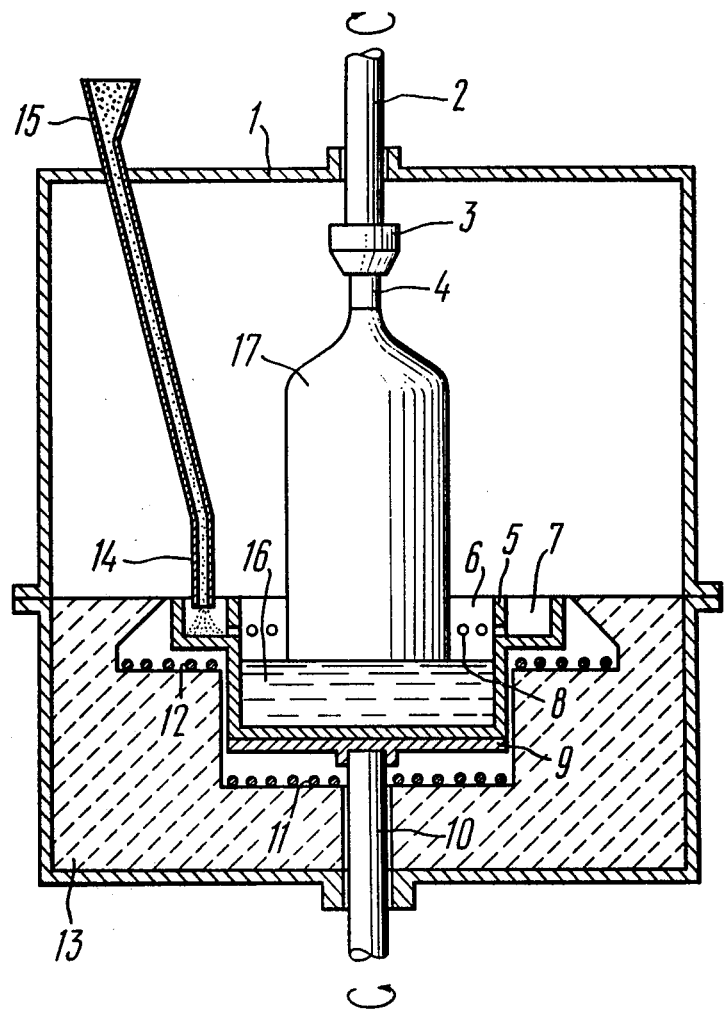

APPARATUS FOR GROWING SINGLE CRYSTALS FROM MELT WITH ADDITIONAL FEEDING OF COMMINUTED CHARGE

The invention relates to the technique of growing single crystals from melt by the method of pulling a single crystal on seed crystal, and in particular, to the technique of pulling single crystals with concurrent additional feeding of starting material to the melt, and more specifically, to an apparatus for growing single crystals from melt with additional feeding of comminuted charge.

The invention may be most efficiently used in growing oriented large-sized single crystals of large length and diameter from melt, such as optical and scintillation alkali halide single crystals, and semiconductor single crystals (germanium, silicon).

Known apparatus for pulling single crystals on seed crystal from melt by the Czochralki method comprises an airtight chamber having water-cooled walls. The bottom part of the chamber accommodates a crucible having its vertical axis generally coinciding with the vertical axis of the chamber. The crucible is mounted on a vertically extending rotary rod which is sealingly received in the chamber through the bottom wall thereof, the rod axis coinciding with the crucible axis.

A heater surrounded by heat insulation is arranged to embrace the crucible. The top part of the chamber accommodates a vertically extending rotary rod having its axis coinciding with the crucible axis. The rod is sealingly received in the chamber through its cover plate and is axially movable. The lower end of the rod supports a seed crystal holder, and the upper rod is coupled to means for imparting thereto a rotary motion and axial reciprocations.

A single crystal is grown in the following manner. Starting material is melted in the crucible, and the rod carrying the seed crystal is lowered until it comes in contact with the melt. After the lower end face of the seed crystal is partially melted, the melt temperature is lowered to such an extent that the seed crystal would not be melted any more. Then the rod carrying the seed crystal is slowly pulled, and a single crystal grows on the seed crystal.

Producing single crystals with pre-set properties and perfect crystalline structure requires compliance with a number of rigorous conditions such as provision of stability and axial symmetry of the thermal field within the growing single crystal and the surrounding melt, maintenance of a pre-set rate of growth and preselected shape of solid-liquid interface, and ensurance of stability of the diameter of the growing single crystal.

While the above-described apparatus for pulling crystals by the Czochralski method enables the production of single crystals of higher quality compared with those obtained by other known methods of growing crystals (a more perfect structure, precise crystallographic orientation and the like), the disadvantage of such equipment resides in a gradual shift of the melt level (hence the solid-liquid interface) downwards relative to the crucible heater thus resulting in an instability of the thermal field in the crystal and the melt.

Known in the art are apparatus additionally comprising means for axially displacing the crucible rod, wherein the displacement of the melt level (solid-liquid interface) downwards is compensated for by continuously lifting the crucible so that the interface is stationary relative to the crucible heater during the growing. Such apparatus cannot ensure sufficient stability of the thermal field within the single crystal being grown since the crucible walls extending over the melt surface function as a variable height thermal shield.

The above-described equipment does not provide for growing single crystals of sufficiently large size because the crystal mass is limited to the mass of the starting material charged in the crucible prior to the beginning of the growth.

Thus, apparatus has come into use comprising means for additional feeding of starting material to the melt, the arrangement or construction of a vertically stationary crucible providing for reception of starting material and its feeding in molten state to the melt zone where the growth of the single crystal being pulled occurs. If a stable level of the melt in the crucible is maintained in such apparatus, the stability of thermal fields in the single crystal being grown and in the melt is ensured.

The basic requirements of such apparatus consist in that they should ensure the possibility of continuous additional feeding of starting material to the melt during the long time needed to obtain a large-sized single crystal and that it should not interfere with the axial symmetry of the thermal field around the single crystal being grown.

Known in the art is an apparatus for pulling single crystals from melt contained in a cylindrical rotary crucible with concurrent continuous additional feeding of a bar of polycrystalline starting material to the melt, the bar being lowered to the melt from the top. The axis of the bar extends vertically adjacent to the crucible wall, and the axis of the crystal seed holder is spaced apart from the crucible axis in the direction opposite to the bar at a distance equal to the diameter of the bar. The disadvantages of this apparatus reside in the lack of axial symmetry of the thermal field around the single crystal being pulled and limited opportunities for growing single crystals of large diameter, that is with a diameter nearly equal to the inside diameter of the crucible.

known in the art is apparatus comprising a stationary crucible consisting of two adjacent and communicating containers having a common heater or individual heaters. Starting material is fed to one container, and a single crystal is pulled from the other container. The disadvantage of apparatus consists in that an axially symmetrical thermal field cannot be obtained because of lack of axial symmetry of the crucible and impossibility of crucible rotation.

German Pat. No. 1188040, discloses an apparatus wherein additional feeding is effected by feeding a round section bar of starting material upwards through a hole in the bottom wall of a cylindrical crucible which is coaxial with the crucible. This apparatus has not found practical application for growing single crystals because of unreliable construction. Even with a minor difference in diameters of the bar and the crucible hole, either melt leakage or jamming of the bar occurs; furthermore, in order to effect the additional feeding through the hole in the crucible bottom wall, the crucible material should not be wetted with the melt material.

In an apparatus disclosed in U.S. Pat. No. 2,892,739, a crucible consists of two cylindrical containers arranged coaxially with respect to each other with a vertical space therebetween equal to the difference in their heights and with a radial space therebetween equal to the difference in their heights and with a radial space therebetween equal to the difference in their radii so that an annular space is defined between them to which charge is fed.

The bottom wall of the inner container has apertures for overflow of melt therein from the annular space. A vertical tube is located over the annular space for feeding comminuted charge. The crucible is mounted on a pedestal which is rigidly connected to a rotary rod having the axis coinciding with the crucible axis. A cylindrical lateral heater surrounds the crucible. The axis of the rod supporting the seed crystal holder coincides with the crucible axis.

The apparatus functions in the following manner. After starting material is melted in the crucible, a seed is introduced to come in contact with the melt. Then, after the seed crystal is partially melted, and an adequate melt temperature is set-up, the process of growing a single crystal begins. Concurrently with the beginning of pulling, feeding of comminuted charge is started through the vertical tube. Charge is admitted from the tube to the annular space of the rotating crucible to be uniformly distributed over its periphery. Particles of the charge enter into the melt and are melted, and the melt in the annular space overflows to the inner container to provide continuous additional feeding of material to the melt contained therein.

The above-described cnstruction ensures axial symmetry of the thermal field around the single crystal being grown. With the same mass rates (the mass rate being the rate in units of mass per unit of time) of charge feeding and of single crystal growth, this construction also provides for a stable position of the solid-liquid interface, hence stability of thermal field within the single crystal being grown and in the melt is achieved.

The main disadvantage of the above-described apparatus resides in that outgrowths may appear on the walls of the annular space extending over the melt surface due to crystallization of the walls of molten drops formed upon fall of charge particles on the melt surface, as well as due to direct incidence of charge particles on the walls and their sticking to them. Gradual increase in size of the outgrowths sooner or later results in complete obturation of the radial gap in the annular space of the crucible, hence in the interruption of charge feeding to the melt and interruption of the growing process. In order to eliminate the formation of outgrowths, the temperature of the annular space walls over the melt surface should be maintained above the melting point of the charge. This is, however, only possible in the case where the diameter of the single crystal being pulled is much smaller than the diameter of the inner container. In the case of growing crystals with large diameter approximately the diameters of the inner container, the maintenance of temperature of the wall extending over the melt surface above the melting point would result in an increase in temperature of the melt over the periphery of the single crystal being pulled above that required for normal growth, that is the conditions would obtain under which it might not be possible to proceed with the growth of crystals.

Another disadvantage of the above-described apparatus resides in a limited possibility of providing an adequate amount of overheating of the melt in the annular space of the crucible. The melt temperature in this space should be by a certain amount higher than the temperature of the melt in the inner crucible, and the difference in these temperatures should be greater, the greater the rate of additional feeding, hence the mass rate of growth of single crystal. Failure to comply with this requirement would result in undermelting of charge fed to the annular space. On the other hand, the melt temperature in the inner container should not be above a certain level which depends on the rate of pulling of the single crystal, its diameter, vertical temperature gradient within the single crystal, etc. Due to a strong influence of the melt temperature in the annular space of the melt temperature in the inner container, these requirements either cannot be complied with at all, in the above-described apparatus, or they may be met with substantial limitations, that is for certain performance parameters only (with sufficiently low mass rates of single crystal growth).

It is an object of the invention to improve the reliability of the apparatus.

Another object of the invention is to enlarge the operating range of the apparatus under various production conditions.

Still another object of the invention is to simplify the construction of the apparatus and lower its cost.

Finally, it is an object of the invention to provide for independent control of the rate of charge melting and rate of growth of single crystal.

These and other objects are accomplished by an apparatus for growing single crystals from melt with additional feeding of comminuted charge, comprising means for pulling single crystal on seed crystal from the melt, a crucible made of two containers mounted coaxially in each other to define an annular space therebetween to which charge is fed, the wall of the inner container having apertures for overflow of melt from said annular space therein, and crucible heaters, according to the invention, the inner container protruding downwards relative to the outer container, and the melt is contained in the protruding portion thereof, and the apertures in the wall of the inner container are arranged at the level of the bottom wall of the outer container, one heater is mounted under the bottom wall of the outer container, and the other heater is located under the bottom wall of the inner container.

In an embodiment of the invention, the heater located under the bottom wall of the outer container is arranged in the plane extending in parallel with the bottom wall of its container.

The invention enables a substantial improvement of reliability of the apparatus due to the elimination of outgrowths on the walls of the annular space of the crucible. The relative arrangement of the outer container bottom wall, inner container bottom wall and surface of the melt column in the crucible, in combination with the arrangement of the apertures for overflow of molten charge at the level of the outer container bottom wall provide for the presence of but a very thin film of melt on the bottom of the annular space (that is on the bottom wall of the outer container); splashing of the melt is completely eliminated upon the fall of charge particles to this thin film. The arrangement of the annular space above the level of melt in the crucible and the provision of the independent heater for the outer container, which heater has but a minimum effect on the melt temperature in the inner container, enable the heating of the walls of the annular space to be effected above the melting point of the, thereby preventing charge particles from sticking to the walls of the annular space. This relative arrangement of various parts of the crucible and the heaters also provides for growing single crystals over a wide range of production conditions of growth, in particular, with high feeding rates, hence high mass rates of growth. In addition, the construction of the apparatus enables an independent control of temperature in the zone of charge melting and in the zone of single crystal growth. The flat shape of the heater of the outer container not only provides for minimization of its effect on the melt temperature in the inner container, but maximum possible orientation of heat provision to the bottom wall of the annular space in which charge is melted is also ensured. Thus, the construction of the apparatus becomes simpler and cheaper, especially where valuable metals, such as platinum, are to be used for making the crucible.

Other objects and advantages of the invention will become apparent from the following detailed description of a specific embodiment thereof with reference to the accompanying drawing diagrammatically showing a vertical section of the apparatus according to the invention.

The apparatus comprises a chamber 1 receiving a rod 2 carrying a holder 3 of a seed crystal 4. A crucible 5 made of an inner container 6 and an outer container 7 communicating through apertures 8 formed at the level of the bottom wall of the outer container 7 is mounted on a support 9 rigidly secured to a rod 10. A part of the inner container 6 protruding downwards relative to the outer container 7 is designed to contain melt. A heater 11 for the inner container 6 is disposed under the support 9, and a flat annular heater 12 is located under the bottom wall of the outer container 7. The heaters 11 and 12 are mounted on a pedestal 13 made of heat insulating material and are independently controlled. A tube 14 for feeding charge to the annular space between the containers 6 and 7 is received at the top in the chamber 1. The vertical axis of the lower portion of the tube 14 is located about in the middle of the annular space of the crucible 5, and the end face of the tube 14 lies either in the plane of the upper end face of the crucible 5 or slightly below it. The apparatus also comprises means (not shown) for imparting rotation and reciprocations to the rod 2 with the holder 3 of the seed crystal 4, for rotation of the rod 10 carrying the support 9 of the crucible 5 and for feeding the charge to a funnel 15 of the tube 14.

The apparatus according to the invention functions in the following manner. Prior to the operation, starting material is charged in the inner container 6 of the crucible 5 in an amount such that after its melting the column of melt 16 should not exceed the height of the part of the inner container 6 protruding downwards. The seed crystal 4 is fixed to the holder 3, and rotary drives of the rods 2 and 10 are activated. Then the heaters 11 and 12 are energized, and the starting charge is melted. The temperature of the heater 12 is then maintained constant, and the temperature of the melt 16 is set to be nearly equal to the crystallization temperature of the starting material, by means of the heater 11. The seed crystal 4 is slowly lowered until it comes in contact with the melt 16. After the seed crystal 4 is partially melted, and an equilibrium is established between the seed crystal 4 and the melt 16 (there should be neither melting nor crystallization on the seed crystal 4), the drives are energized to lift the rod 2 and the holder 3 of the seed crystal 4, as well as the drive for feeding charge to the funnel 15 of the tube 14. Further, the rate of pulling is maintained constant and the temperature of the bottom heater 11 is controlled so that a single crystal 17 of desired diameter grows on the seed crystal 4. At the stage of growing of single-crystal 17 from the seed crystal 4 to a pre-set final diameter, the rate of charge being fed to the funnel 15 is gradually increased in accordance with the increase in the mass rate of growth of the single crystal 17 enlarging in diameter. After the pre-set final diameter is achieved, the feeding rate is then maintained at constant level.

With maintenance of the same mass rates of growth and of feeding at all stages of the growing process, the level of the melt 16 in the crucible 5, hence the solid-liquid interface, does not change its position relative to the heaters 11, 12 and crucible 5 thus ensuring a stable thermal field at the interface.

The above-described temperature control process for the bottom heater 11 may be performed by means of an automatic control system including a transducer feeding an electric signal proportional to the mass rate of growth of the single crystal 17 (such as a transducer sensing the weight of the single crystal, weight of the melt, a single crystal diameter sensor, etc.). In such case, the feeding rate at the stage of growing of the single crystal 17 from the seed crystal 4 to the pre-set final diameter is preferably controlled by programming it to comply with the requirement of equality of mass rates of feeding and growth of the single crystal 17.

What is claimed is:

1. An apparatus for growing single crystals from melt with means for feeding additional comminuted charge, which apparatus comprises a crucible made of two containers—an inner container and an outer container-mounted coaxially in each other to define containing means comprising an annular space therebetween for said additional charge to which said additional charge is fed by said feeding means, said inner container protruding downwards relative to said outer container, said melt being contained in said protruding part of said inner container; apertures provided in the wall of said inner container at the level of the bottom wall of said outer container for overflow of said melt therefrom to said inner container; independent heaters, one of said heaters being disposed under the bottom wall of said outer container and the other heater being located under the bottom wall of said inner container.

2. An apparatus according to claim 1, wherein said heater located under the bottom of said outer container is disposed in a plane extending substantially in parallel with the bottom wall of said outer container.

* * * * *